US007752530B2

(12) United States Patent
Wang et al.

(10) Patent No.: US 7,752,530 B2
(45) Date of Patent: Jul. 6, 2010

(54) APPARATUS AND METHOD FOR A COLLISION-FREE PARALLEL TURBO DECODER IN A SOFTWARE-DEFINED RADIO SYSTEM

(75) Inventors: Yan Wang, Plano, TX (US); Eran Pisek, Plano, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 933 days.

(21) Appl. No.: 11/581,674

(22) Filed: Oct. 16, 2006

(65) Prior Publication Data

US 2007/0124655 A1      May 31, 2007

Related U.S. Application Data

(60) Provisional application No. 60/735,683, filed on Nov. 10, 2005, provisional application No. 60/800,323, filed on May 15, 2006, provisional application No. 60/802,712, filed on May 23, 2006.

(51) Int. Cl.
*H03M 13/03* (2006.01)
(52) U.S. Cl. .................. 714/786; 714/755; 714/794; 714/795; 714/757; 375/341; 375/262
(58) Field of Classification Search .............. 714/794, 714/795, 755, 786, 762, 788, 763, 757; 375/341, 375/262
See application file for complete search history.

(56) References Cited

U.S. PATENT DOCUMENTS

| 5,432,804 | A | * | 7/1995 | Diamondstein et al. | ..... 714/795 |
| 2003/0203717 | A1 | * | 10/2003 | Chuprun et al. | ............ 455/12.1 |
| 2004/0063425 | A1 | * | 4/2004 | Wakutsu et al. | ............. 455/418 |
| 2005/0097306 | A1 | * | 5/2005 | Gajski | ........................ 712/245 |

* cited by examiner

Primary Examiner—Guy J Lamarre

(57) ABSTRACT

A reconfigurable maximum a-posteriori probability (MAP) calculation circuit for decoding binary and duo-binary code. The reconfigurable MAP calculation circuit comprises M memory banks for storing N input data samples. Each input data sample comprises systematic data, non-interleaved parity data and interleaved parity data. The N input data samples are divided into M logical blocks and input data samples from each logical block are stored in each of the M memory banks. The reconfigurable MAP calculation circuit comprises M processing units. Each processing unit processes one of the M logical blocks. The reconfigurable MAP calculation circuit comprises a communication switch for coupling the M processing units to the M memory banks such that the M processing units simultaneously access input data samples from each of the M logical blocks in each of the M memory banks without collision.

24 Claims, 11 Drawing Sheets

| N | P0 | P1 | P2 | P3 |
|---|---|---|---|---|
| 24 | 5 | 0 | 0 | 0 |
| 48 | 13 | 24 | 0 | 24 |
| 72 | 11 | 6 | 0 | 6 |
| 96 | 7 | 48 | 24 | 72 |
| 144 | 17 | 74 | 72 | 2 |
| 192 | 11 | 96 | 48 | 144 |
| 240 | 13 | 120 | 60 | 180 |
| 480 | 13 | 240 | 120 | 360 |
| 960 | 13 | 480 | 240 | 720 |
| 1440 | 17 | 720 | 360 | 540 |
| 1920 | 17 | 960 | 480 | 1440 |
| 2400 | 17 | 1200 | 600 | 1800 |

FIG. 5

|     | C0  | C1  | C2  | C3  |
|-----|-----|-----|-----|-----|
| R0  | 0   | 1   | 2   | 3   |
| R1  | 4   | 5   | 6   | 7   |
| R2  | 8   | 9   | 10  | 11  |
|     |     | ⋮   |     |     |
| R13 | 52  | 53  | 54  | 55  |
| R14 | 56  | 57  | 58  | 59  |
| R15 | 60  |     |     |     |

BLOCK 0

|     | C0  | C1  | C2  | C3  |
|-----|-----|-----|-----|-----|
| R15 |     | 61  | 62  | 63  |
| R16 | 64  | 65  | 66  | 67  |
| R17 | 68  | 69  | 70  | 71  |
|     |     | ⋮   |     |     |
| R28 | 112 | 113 | 114 | 115 |
| R29 | 116 | 117 | 118 | 119 |
| R30 | 120 | 121 |     |     |

BLOCK 1

|     | C0  | C1  | C2  | C3  |
|-----|-----|-----|-----|-----|
| R30 |     |     | 122 | 123 |
| R31 | 124 | 125 | 126 | 127 |
| R32 | 128 | 129 | 130 | 131 |
|     |     | ⋮   |     |     |
| R43 | 172 | 173 | 174 | 175 |
| R44 | 176 | 177 | 178 | 179 |
| R45 | 180 | 181 | 182 |     |

BLOCK 2

|     | C0  | C1  | C2  | C3  |
|-----|-----|-----|-----|-----|
| R45 |     |     |     | 183 |
| R46 | 184 | 185 | 186 | 187 |
| R47 | 188 | 189 | 190 | 191 |
|     |     | ⋮   |     |     |
| R58 | 232 | 233 | 234 | 235 |
| R59 | 236 | 237 | 238 | 239 |

BLOCK 3

FIG. 6

| | C0 | C1 | C2 | C3 |
|---|---|---|---|---|
| R0 → | 1 | 14 | 87 | 100 |
| R1 → | 53 | 66 | 139 | 152 |
| | 105 | 118 | 191 | 204 |
| | 157 | 170 | 3 | 16 |
| | 209 | 222 | 55 | 68 |
| R5 → | 21 | 34 | 107 | 120 |
| | 73 | 86 | 159 | 172 |
| | 125 | 138 | 211 | 224 |
| | 177 | 190 | 23 | 36 |
| | 229 | 2 | 75 | 88 |
| R10 → | 41 | 54 | 127 | 140 |
| | 93 | 106 | 179 | 192 |
| | 145 | 158 | 231 | 4 |
| | 197 | 210 | 43 | 56 |
| | 9 | 22 | 95 | 108 |
| R15 → | 61 | 74 | 147 | 160 |
| | 113 | 126 | 199 | 212 |
| | 165 | 178 | 11 | 24 |
| | 217 | 230 | 63 | 76 |
| | 29 | 42 | 115 | 128 |
| R20 → | 81 | 94 | 167 | 180 |
| | 133 | 146 | 219 | 232 |
| | 185 | 198 | 31 | 44 |
| | 237 | 10 | 83 | 96 |
| | 49 | 62 | 135 | 148 |
| R25 → | 101 | 114 | 187 | 200 |
| | 135 | 166 | 239 | 12 |
| | 205 | 218 | 51 | 64 |
| | 17 | 30 | 103 | 116 |
| | 69 | 82 | 155 | 168 |
| R30 → | 121 | 134 | 207 | 220 |
| | 173 | 186 | 19 | 32 |
| | 225 | 238 | 71 | 84 |
| | 37 | 50 | 123 | 136 |
| | 89 | 102 | 175 | 188 |
| R35 → | 141 | 154 | 227 | 0 |
| | 193 | 206 | 39 | 52 |
| | 5 | 18 | 91 | 104 |
| | 57 | 70 | 143 | 156 |

FIG. 7-2

| | | | | |
|---|---|---|---|---|
| | 109 | 122 | 195 | 208 |
| R40 → | 161 | 174 | 7 | 20 |
| | 213 | 226 | 59 | 72 |
| | 25 | 38 | 111 | 124 |
| | 77 | 90 | 163 | 176 |
| | 129 | 142 | 215 | 228 |
| R45 → | 181 | 194 | 27 | 40 |
| | 233 | 6 | 79 | 92 |
| | 45 | 58 | 131 | 144 |
| | 97 | 110 | 183 | 196 |
| | 149 | 162 | 235 | 8 |
| R50 → | 201 | 214 | 47 | 60 |
| | 13 | 26 | 99 | 112 |
| | 65 | 78 | 151 | 164 |
| | 117 | 130 | 203 | 216 |
| | 169 | 182 | 15 | 28 |
| R55 → | 221 | 234 | 67 | 80 |
| | 33 | 46 | 119 | 132 |
| | 85 | 98 | 171 | 184 |
| | 137 | 150 | 223 | 236 |
| R59 → | 189 | 202 | 35 | 48 |

FIG. 9-2

| | | | | | | | | |
|---|---|---|---|---|---|---|---|---|
| | 2 | | 3 | | 0 | | 1 | |
| R40 → | 3 | | 0 | | 1 | | 2 | |
| | 0 | | 1 | | 2 | | 3 | |
| | 1 | | 2 | | 3 | | 0 | |
| | 2 | | 3 | | 0 | | 1 | |
| | 3 | | 0 | | 1 | | 2 | |
| R45 → | 0 | | 1 | | 2 | | 3 | |
| | 1 | | 2 | | 3 | | 0 | |
| | 2 | | 3 | | 0 | | 1 | |
| | 3 | | 0 | | 1 | | 2 | |
| | 0 | | 1 | | 2 | | 3 | |
| R50 → | 1 | | 2 | | 3 | | 0 | |
| | 2 | 27 | 3 | 51 | 0 | 31 | 1 | 55 |
| | 3 | 36 | 0 | 16 | 1 | 40 | 2 | 49 |
| | 0 | 1 | 1 | 25 | 2 | 34 | 3 | 58 |
| | 1 | 10 | 2 | 19 | 3 | 43 | 0 | 23 |
| R55 → | 2 | 4 | 3 | 28 | 0 | 8 | 1 | 32 |
| | 3 | 13 | 0 | 53 | 1 | 17 | 2 | 26 |
| | 0 | 38 | 1 | 2 | 2 | 11 | | |
| | 1 | 47 | 2 | 56 | 3 | 20 | | |
| | 2 | 41 | 3 | 5 | 0 | 45 | | |
| R60 → | 3 | 50 | 0 | 30 | 1 | 54 | | |

|  | C0 BANK | C0 ADDR. | C1 BANK | C1 ADDR. | C2 BANK | C2 ADDR. | C3 BANK | C3 ADDR. |
|---|---|---|---|---|---|---|---|---|
| R0 → | 3 | 35 | 0 | 15 | 1 | 39 | 2 | 48 |
|  | 0 | 0 | 1 | 24 | 2 | 33 | 3 | 57 |
|  | 1 | 9 | 2 | 18 | 3 | 42 | 0 | 22 |
|  | 2 | 3 | 3 | 27 | 0 | 7 | 1 | 31 |
|  | 3 | 12 | 0 | 52 | 1 | 16 | 2 | 25 |
| R5 → | 0 | 37 | 1 | 1 | 2 | 10 | 3 | 34 |
|  | 1 | 46 | 2 | 55 | 3 | 19 | 0 | 59 |
|  | 2 | 40 | 3 | 4 | 0 | 44 | 1 | 8 |
|  | 3 | 49 | 0 | 29 | 1 | 53 | 2 | 2 |
|  | 0 | 14 | 1 | 38 | 2 | 47 | 3 | 11 |
| R10 → | 1 | 23 | 2 | 32 | 3 | 56 | 0 | 36 |
|  | 2 | 17 | 3 | 41 | 0 | 21 | 1 | 45 |
|  | 3 | 26 | 0 | 6 | 1 | 30 | 2 | 39 |
|  | 0 | 51 | 1 | 15 | 2 | 24 | 3 | 48 |
|  | 1 | 0 | 2 | 9 | 3 | 33 | 0 | 13 |
| R15 → | 2 | 54 | 3 | 18 | 0 | 58 | 1 | 22 |
|  | 3 |  | 0 |  | 1 |  | 2 |  |
|  | 0 |  | 1 |  | 2 |  | 3 |  |
|  | 1 |  | 2 |  | 3 |  | 0 |  |
|  | 2 |  | 3 |  | 0 |  | 1 |  |
| R20 → | 3 |  | 0 |  | 1 |  | 2 |  |
|  | 0 |  | 1 |  | 2 |  | 3 |  |
|  | 1 |  | 2 |  | 3 |  | 0 |  |
|  | 2 |  | 3 |  | 0 |  | 1 |  |
|  | 3 |  | 0 |  | 1 |  | 2 |  |
| R25 → | 0 |  | 1 |  | 2 |  | 3 |  |
|  | 1 |  | 2 |  | 3 |  | 0 |  |
|  | 2 |  | 3 |  | 0 |  | 1 |  |
|  | 3 |  | 0 |  | 1 |  | 2 |  |
|  | 0 |  | 1 |  | 2 |  | 3 |  |
| R30 → | 1 |  | 2 |  | 3 |  | 0 |  |
|  | 2 |  | 3 |  | 0 |  | 1 |  |
|  | 3 |  | 0 |  | 1 |  | 2 |  |
|  | 0 |  | 1 |  | 2 |  | 3 |  |
|  | 1 |  | 2 |  | 3 |  | 0 |  |
| R35 → | 2 |  | 3 |  | 0 |  | 1 |  |
|  | 3 |  | 0 |  | 1 |  | 2 |  |
|  | 0 |  | 1 |  | 2 |  | 3 |  |
|  | 1 |  | 2 |  | 3 |  | 0 |  |

APPARATUS AND METHOD FOR A COLLISION-FREE PARALLEL TURBO DECODER IN A SOFTWARE-DEFINED RADIO SYSTEM

CROSS-REFERENCE TO RELATED APPLICATIONS AND CLAIM OF PRIORITY

This application is related to U.S. Provisional Patent No. 60/735,683, filed Nov. 10, 2005, entitled "Parallel Turbo Code Interleaver/Deinterleaver", to U.S. Provisional Patent No. 60/800,323, filed May 15, 2006, entitled "Parallel Turbo Code Interleaver/Deinterleaver", and to U.S. Provisional Patent No. 60/802,712, filed May 23, 2006, entitled "Parallel Turbo Code Interleaver/Deinterleaver". Provisional Patent Nos. 60/735,683, 60/800,323 and 60/802,712 are assigned to the assignee of this application and are incorporated by reference as if fully set forth herein. This application claims priority under 35 U.S.C. §119(e) to Provisional Patent Nos. 60/735,683, 60/800,323 and 60/802,712.

This application is related to U.S. patent application Ser. No. 11/225,479, filed Sep. 13, 2005, entitled "Turbo Decoder Architecture For Use In Software-Defined Radio Systems." Application Ser. No. 11/225,479 is assigned to the assignee of this application and is incorporated by reference into this application as if fully set forth herein.

TECHNICAL FIELD OF THE INVENTION

The present application relates generally to a turbo decoder and, more specifically, to an interleaver-deinterleaver apparatus for use in a parallel architecture turbo decoder.

BACKGROUND OF THE INVENTION

The maximum a-posteriori probability (MAP) algorithm is used in a number of coding schemes to improve the performance of communication systems. Maximum a-posteriori probability (MAP) decoders are used in, for example, turbo code-based radio frequency (RF) transceivers. Turbo coding is a powerful forward error correction (FEC) algorithm that achieves a coding gain close to the Shannon limit. Turbo encoders and turbo decoders have been adopted for use in the physical layers of a number of wireless standards, including WCDMA, CDMA2000, IEEE-802.16e (i.e., WiBro) and others. Thus, MAP decoders are implemented in, for example, WCDMA 8PCCC turbo decoders and in 802.16/Wibro CTC turbo decoders.

A software-defined radio (SDR) device uses reconfigurable hardware that may be programmed over-the-air to operate under different wireless standards. For example, an SDR transceiver in a wireless laptop computer or PDA may be configured by different software loads to operate in an IEEE-802.11x wireless network, a CDMA2000 wireless network, an OFDM/OFDMA wireless network, a GSM wireless network, or other types of networks. Many of these wireless standards require the use of turbo decoders or other decoders that are based on maximum a-posteriori probability (MAP) decoders.

However, conventional decoders have significant drawbacks with respect to SDR applications. Turbo decoders and other types of decoders are optimized for decoding under only one or two specific standards. Conventional designs use different MAP decoders to support each standard separately. For example, a MAP decoder calculates three values: alpha ($\alpha$), beta ($\beta$), and lambda ($\gamma$). Normally, three distinct hardware blocks are used to calculate these values. This increases power consumption and uses a large amount of die space.

If an SDR device is required to support many wireless standards, more than one decoder must be implemented in the SDR device. This leads to a complex transceiver design that makes inefficient use of chip space and has high power dissipation. This also increases development cost and time-to-market (TTM). Additionally, some of the newer wireless standards operate at relatively high data rates (e.g., WiBro, HSPDA, and the like). A decoder that is optimized in terms of speed and power consumption for a low data rate standard is unlikely to be optimized in terms of speed and power consumption for a high data rate standard, and vice versa. Thus, conventional decoder designs are not suitable for use in SDR applications.

The higher target data rates, the iterative nature of turbo decoding for optimal performance, and certain other factors indicate that some parallelism is necessary in turbo decoder design. A sliding window (SW) may be used to split a block into sub-blocks that may be decoded in parallel. Each sub-block requires separate memory to maximize throughput when reading or writing extrinsic information (i.e., lambda ($\lambda$) values).

The reading or writing should be in a permuted order according to the interleaver pattern. However, the pattern will very likely introduce collisions when two or more extrinsic values are read from or written to the same memory address during the same clock cycle. Such collisions adversely affect the performance of a parallel turbo decoder. Conventional solutions duplicate the interleaved data in each memory in order to avoid collisions. However, this results in increased memory size and increased power.

Therefore, there is a need in the art for an improved reconfigurable decoder for use in a software-defined radio (SDR) system. In particular, there is a need for a maximum a-posteriori probability (MAP) decoder that may be implemented in a reconfigurable decoder that operates under different wireless standards. More particularly, there is a need for an interleaved function that avoids memory collisions when reading or writing extrinsic information (i.e., lambda ($\lambda$) values) during execution of the MAP algorithm.

SUMMARY OF THE INVENTION

A reconfigurable maximum a-posteriori probability (MAP) calculation circuit is provided for decoding duo-binary code data and binary code data. In one embodiment of the disclosure, the reconfigurable MAP calculation circuit comprises M memory banks for storing N input data samples, wherein each input data sample comprises systematic data, non-interleaved parity data and interleaved parity data. The N input data samples are logically divided into M logical blocks and input data samples from each of the M logical blocks are stored in each of the M memory banks.

The reconfigurable MAP calculation circuit further comprises M processing units for performing MAP calculations, wherein each of the M processing units is capable of accessing each of the N input data samples in the M memory banks and wherein each of the M processing units is dedicated to processing one of the M logical blocks of input data samples. The reconfigurable MAP calculation circuit also comprises a communication switch capable of coupling the M processing units to the M memory banks and an address generator for controlling the communication switch and the M processing units such that the M processing units simultaneously access input data samples from each of the M logical blocks in each of the M memory banks without collision.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 5 is an table of exemplary interleaver parameters for interleaving data according to an IEEE-802.16d wireless protocol;

FIG. 6 illustrates a table of 240 sets of duo-binary data (i.e., WiBro operation) that are logically segmented into blocks for processing by the MAP datapaths in FIG. 4A;

DETAILED DESCRIPTION OF THE INVENTION

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged processing system.

In the descriptions that follow, the interleaver-deinterleaver switch block disclosed herein is implemented as part of a turbo decoder that provides a high degree of parallelism to support high data rate standards. The exemplary turbo decoder was disclosed in U.S. patent application Ser. No. 11/225,479, incorporated by reference above.

The reconfigurable turbo decoder supports multimode operation for decoding in different communication standards, including WCDMA, CDMA2000, IEEE-802.16e (i.e., WiBro), among others. The disclosed turbo decoder is adaptable to operate at different data rates, thereby providing support for standards such as WiBro, WCDMA, HSDPA, and others, which operate at many different data rates. The disclosed turbo decoder architecture is optimized not only for the maximum data rates, but also for different data rate ranges.

In one embodiment of the disclosure, the reconfigurable turbo decoder described herein may be implemented using a context-based operation reconfigurable instruction set processor (CRISP) device. CRISP devices are described in detail in U.S. patent application Ser. No. 11/123,313, which is hereby incorporated by reference.

Figure 1:
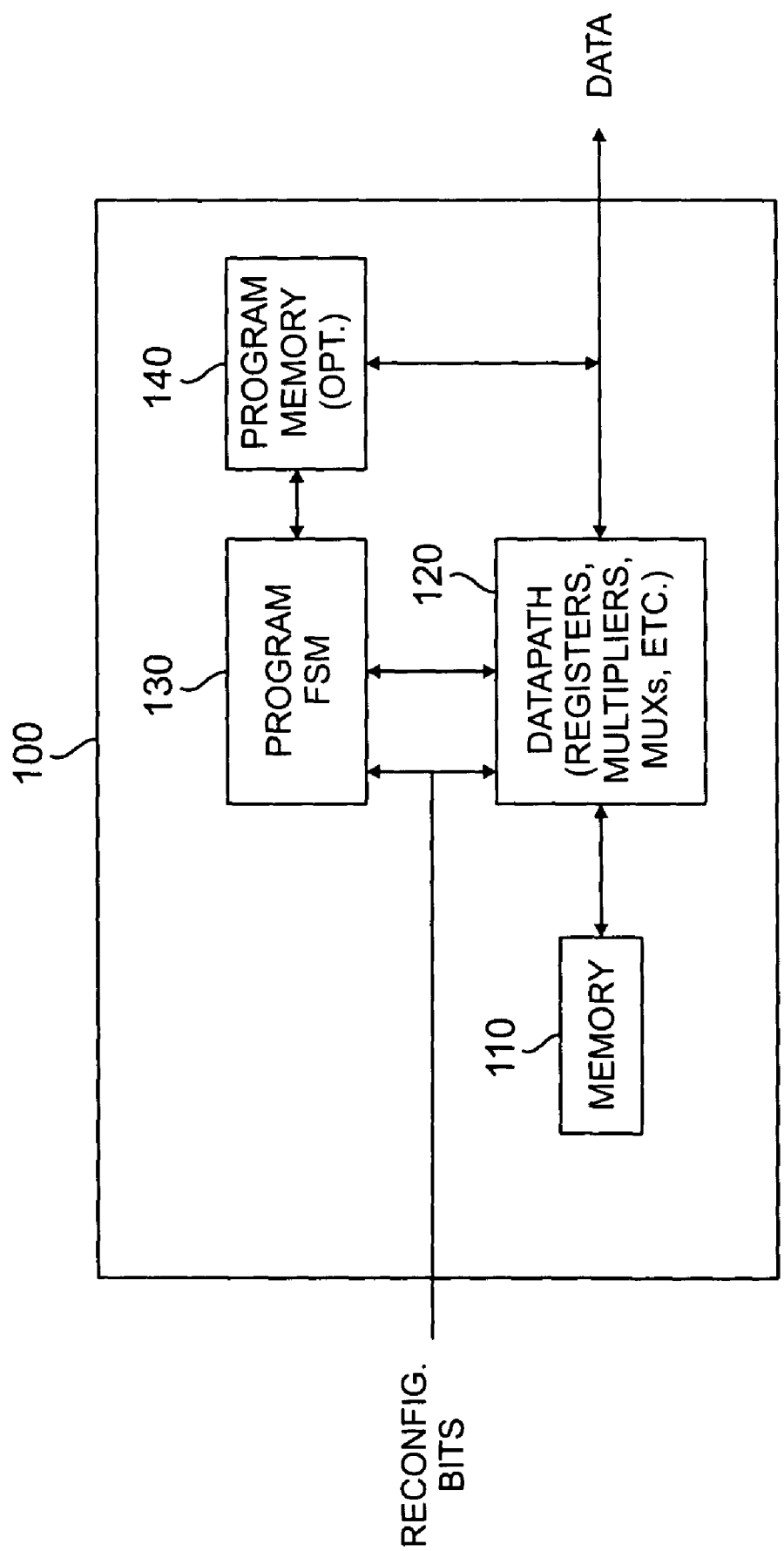
FIG. 1 is a high-level block diagram of a CRISP device containing a maximum a-posteriori probability (MAP) decoder that implements an interleaver and deinterleaver function according to the principles of the present disclosure.

FIG. 1 is a high-level block diagram of context-based operation reconfigurable instruction set processor (CRISP) 100, which contains a maximum a-posteriori probability (MAP) decoder that implements an interleaver and deinterleaver function according to the principles of the present disclosure. CRISP 100 comprises memory 110, programmable data path circuitry 120, programmable finite state machine 130, and optional program memory 140. A context is a group of instructions of a data processor that are related to a particular function or application, such as turbo decoding instructions. As described in U.S. patent application Ser. No. 11/123,313, CRISP 100 implements only a subset of context-related instructions in an optimum manner.

Context-based operation reconfigurable instruction set processor (CRISP) 100 defines the generic hardware block that usually consists of higher level hardware processor blocks. The principle advantage to CRISP 100 is that CRISP 100 breaks down the required application into two main domains, a control domain and a data path domain, and optimizes each domain separately. By performing turbo decoding in CRISP 100, the disclosed turbo decoder reduces the problems related to flexibility and power consumption that affect conventional turbo decoders.

The control domain is implemented by programmable finite state machine 130, which may comprise a DSP, an MCU or another prior art device. Programmable FSM 130 is configured by reconfiguration bits received from an external controller (not shown). Programmable FSM 130 may execute a program stored in associated optional program memory 140. The program may be stored in program memory 140 via the DATA line from an external controller (not shown). Memory 110 is used to store application data used by data path circuitry 120.

Programmable data path circuitry 120 is divided into sets of building blocks that perform particular functions (e.g., registers, multiplexers, multipliers, and the like). Each of the building blocks is both reconfigurable and programmable to allow maximum flexibility. The division of programmable data path circuitry 120 into functional blocks depends on the level of reconfigurability and programmability required for a particular application.

Since different contexts are implemented by separate CRISP devices that work independently of other CRISP devices, implementing a turbo decoder using one or more CRISP devices provides an efficient power management scheme that is able to shut down a CRISP when the CRISP is not required. This assures that only the CRISPs that are needed at a given time are active, while other idle CRISPs do not consume significant power.

Figure 2:
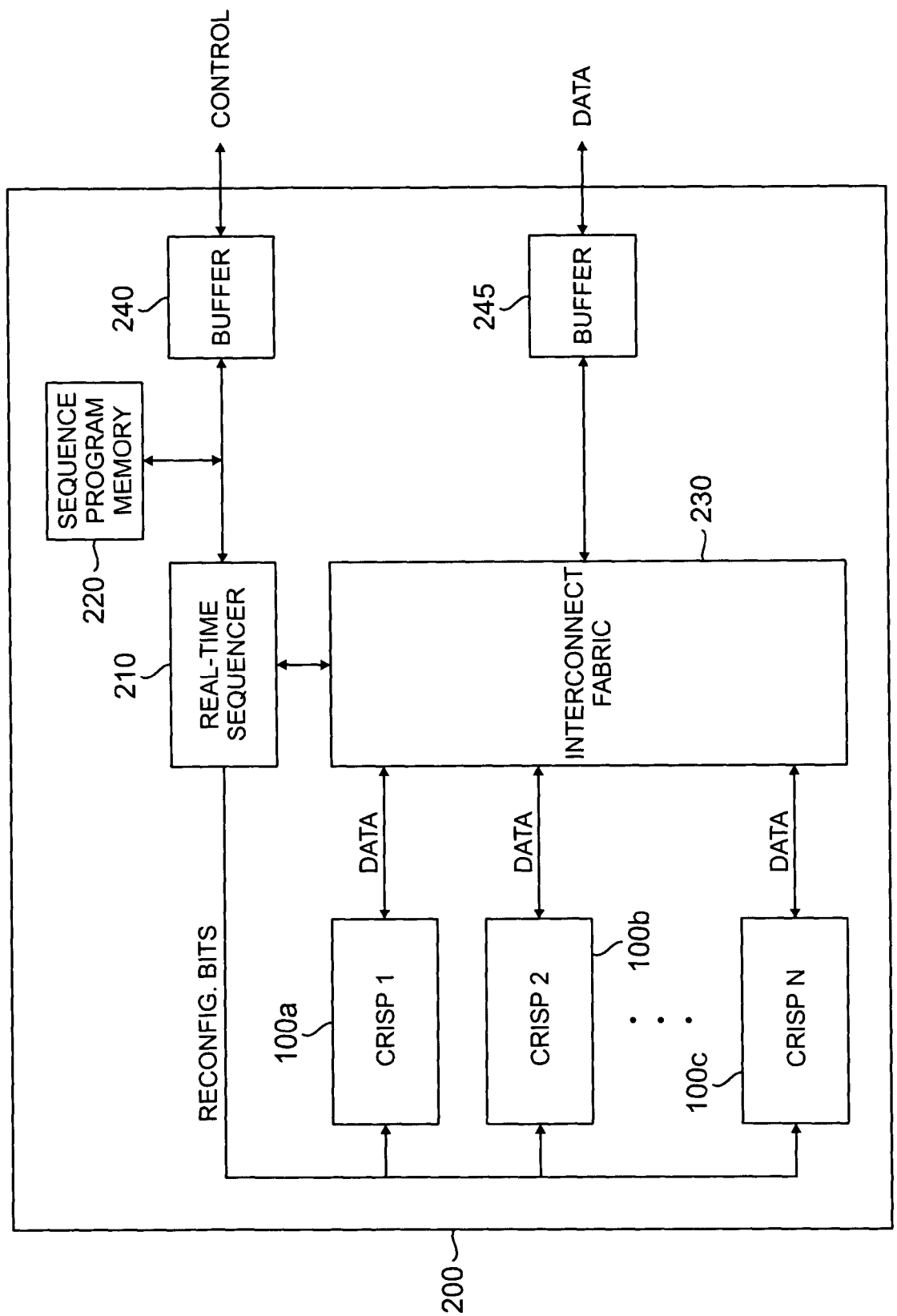
FIG. 2 is a high-level block diagram of a reconfigurable processing system.

FIG. 2 is a high-level block diagram of reconfigurable processing system 200 according to one embodiment of the present disclosure. Reconfigurable processing system 200 comprises N context-based operation reconfigurable instruction set processors (CRISPs), including exemplary CRISPs 100a, 100b, and 100c, which are arbitrarily labeled CRISP 1, CRISP 2 and CRISP N. Reconfigurable processing system 200 further comprises real-time sequencer 210, sequence program memory 220, programmable interconnect fabric 230, and buffers 240 and 245.

Reconfiguration bits may be loaded into CRISPs 100a, 100b, and 100c from the CONTROL line via real-time sequencer 210 and buffer 240. A control program may also be loaded into sequence program memory 220 from the CONTROL line via buffer 240. Real-time sequencer 210 sequences the contexts to be executed by each one of CRISPs 100a-c by retrieving program instructions from program memory 220 and sending reconfiguration bits to CRISPs 100a-c. In an exemplary embodiment, real-time sequencer 210 may comprise a stack processor, which is suitable to operate as a real-time scheduler due to its low latency and simplicity.

Reconfigurable interconnect fabric 230 provides connectivity between each one of CRISPs 100a-c and an external DATA bus via bi-directional buffer 245. In an exemplary embodiment of the present disclosure, each one of CRISPs 100a-c may act as a master of reconfigurable interconnect fabric 230 and may initiate address access. The bus arbiter for reconfigurable interconnect fabric 230 may be internal to real-time sequencer 210.

In an exemplary embodiment, reconfigurable processing system 200 may be, for example, a cell phone or a similar wireless device, or a data processor for use in a laptop computer. In a wireless device embodiment based on a software-defined radio (SDR) architecture, each one of CRISPs 100a-c is responsible for executing a subset of context-related instructions that are associated with a particular reconfigurable function. For example, CRISP 100a may be configured to execute context-related instructions that process CDMA baseband signals or OFDMA baseband signals. CRISP 100b may be configured to execute context-related instructions that act as a memory controller. CRISP 100c may be configured to execute context-related instructions that perform turbo decoding or Viterbi decoding.

Since CRISP devices are largely independent and may be run simultaneously, a turbo decoder implemented using one or more CRISP devices has the performance advantage of parallelism without incurring the full power penalty associated with running parallel operations. The loose coupling and independence of CRISP devices allows them to be configured for different systems and functions that may be shut down separately.

Figure 3:
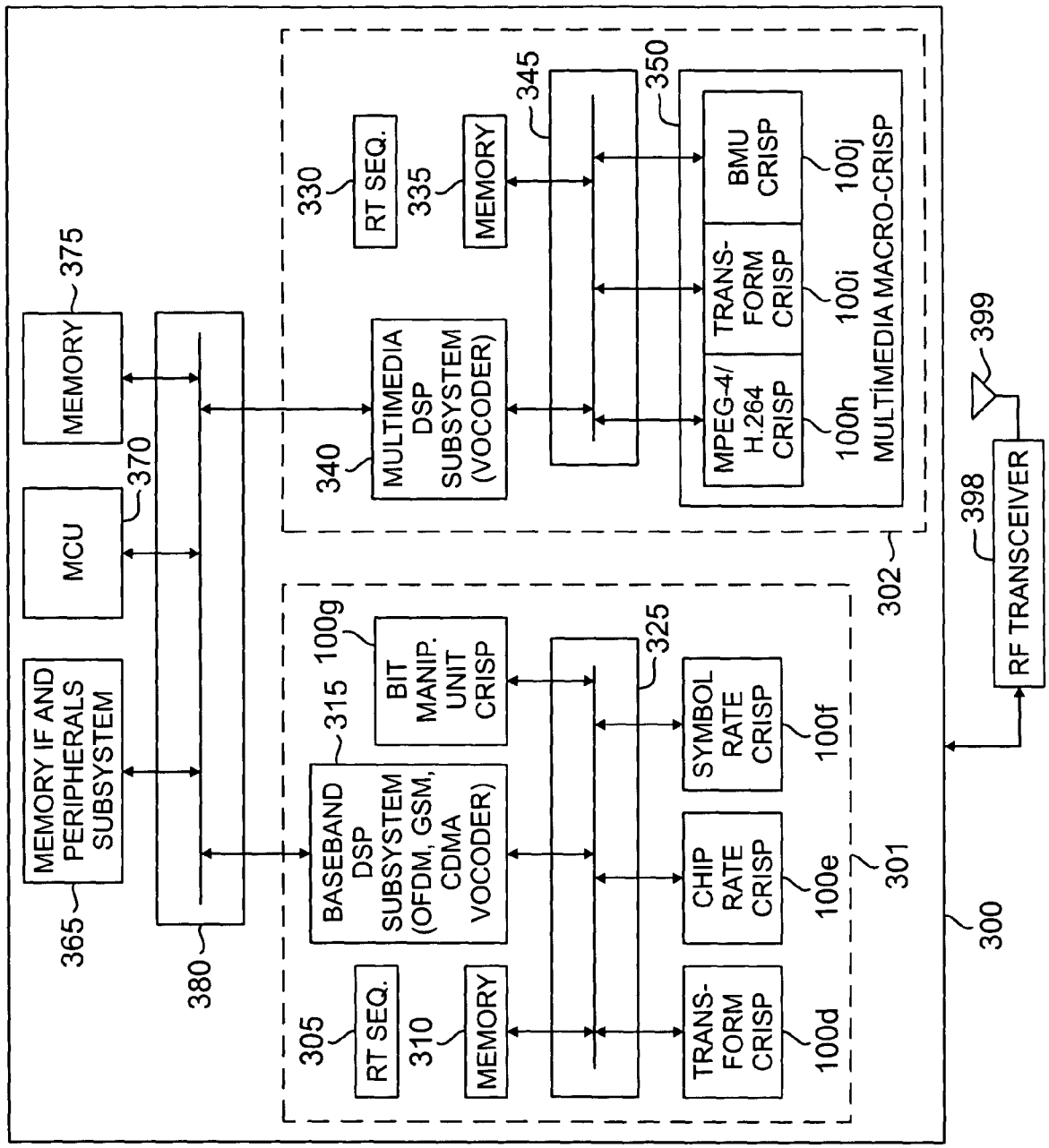
FIG. 3 is a high-level block diagram of a multi-standard software-defined radio (SDR) system containing a reconfigurable maximum a-posteriori probability (MAP) decoder that implements an interleaver and deinterleaver function according to the principles of the present disclosure.

FIG. 3 is a high-level block diagram of multi-standard software-defined radio (SDR) system 300, which contains a reconfigurable maximum a-posteriori probability (MAP) decoder that implements an interleaver and deinterleaver function according to the principles of the present disclosure. SDR system 300 may comprise a wireless terminal (or mobile station, subscriber station, etc.) that accesses a wireless network, such as, for example, a GSM or CDMA cellular telephone, a PDA with WCDMA, IEEE-802.11x, OFDM/OFDMA capabilities, or the like.

Multi-standard SDR system 300 comprises baseband subsystem 301, applications subsystem 302, memory interface (IF) and peripherals subsystem 365, main control unit (MCU) 370, memory 375, and interconnect 380. MCU 370 may comprise, for example, a conventional microcontroller or a microprocessor (e.g., x86, ARM, RISC, DSP, etc.). Memory IF and peripherals subsystem 365 may connect SDR system 300 to an external memory (not shown) and to external peripherals (not shown). Memory 375 stores data from other components in SDR system 300 and from external devices (not shown). For example, memory 375 may store a stream of incoming data samples associated with a down-converted signal generated by radio frequency (RF) transceiver 398 and antenna 399 associated with SDR system 300. Interconnect 380 acts as a system bus that provides data transfer between subsystems 301 and 302, memory IF and peripherals subsystem 365, MCU 370, and memory 375.

Baseband subsystem 301 comprises real-time (RT) sequencer 305, memory 310, baseband DSP subsystem 315, interconnect 325, and a plurality of special purpose context-based operation instruction set processors (CRISPs), including transform CRISP 100d, chip rate CRISP 100e, symbol rate CRISP 100f, and bit manipulation unit (BMU) CRISP 100g. By way of example, transform CRISP 100d may implement a Fast Fourier Transform (FFT) function, chip rate CRISP 100e may implement a correlation function for a CDMA signal, and symbol rate CRISP 100f may implement a turbo decoder function or a Viterbi decoder function.

In such an exemplary embodiment, transform CRISP 100d may receive samples of an intermediate frequency (IF) signal stored in memory 375 and perform an FFT function that generates a sequence of chip samples at a baseband rate. Next, chip rate CRISP 100e receives the chip samples from transform CRISP 100d and performs a correlation function that generates a sequence of data symbols. Next, symbol rate CRISP 100f receives the symbol data from chip rate CRISP 100e and performs turbo decoding or Viterbi decoding to recover the baseband user data. The baseband user data may then be used by applications subsystem 302.

In an exemplary embodiment of the present disclosure, symbol rate CRISP 100f may comprise two or more CRISPs that operate in parallel. Also, by way of example, BMU CRISP 100g may implement such functions as variable length coding, cyclic redundancy check (CRC), convolutional encoding, and the like. Interconnect 325 acts as a system bus that provides data transfer between RT sequencer 305, memory 310, baseband DSP subsystem 315 and CRISPs 100d-100g.

Applications subsystem 302 comprises real-time (RT) sequencer 330, memory 335, multimedia DSP subsystem 340, interconnect 345, and multimedia macro-CRISP 350. Multimedia macro-CRISP 350 comprises a plurality of special purpose context-based operation instruction set processors, including MPEG-4/H.264 CRISP 550h, transform CRISP 550i, and BMU CRISP 100j. In an exemplary embodiment of the disclosure, MPEG-4/H.264 CRISP 550h performs motion estimation functions and transform CRISP 100h performs a discrete cosine transform (DCT) function. Interconnect 380 provides data transfer between RT sequencer 330, memory 335, multimedia DSP subsystem 340, and multimedia macro-CRISP 350.

In the embodiment in FIG. 3, the use of CRISP devices enables applications subsystem 302 of multi-standard SDR system 300 to be reconfigured to support multiple video standards with multiple profiles and sizes. Additionally, the use of CRISP devices enables baseband subsystem 301 of multi-standard SDR system 300 to be reconfigured to support multiple air interface standards. Thus, SDR system 300 is able to operate in different types of wireless networks (e.g., CDMA, GSM, 802.11x, etc.) and can execute different types of video and audio formats. However, the use of CRISPS according to the principles of the present disclosure enables SDR system 300 to perform these functions with much lower power consumption than conventional wireless devices having comparable capabilities.

Figure 4A:
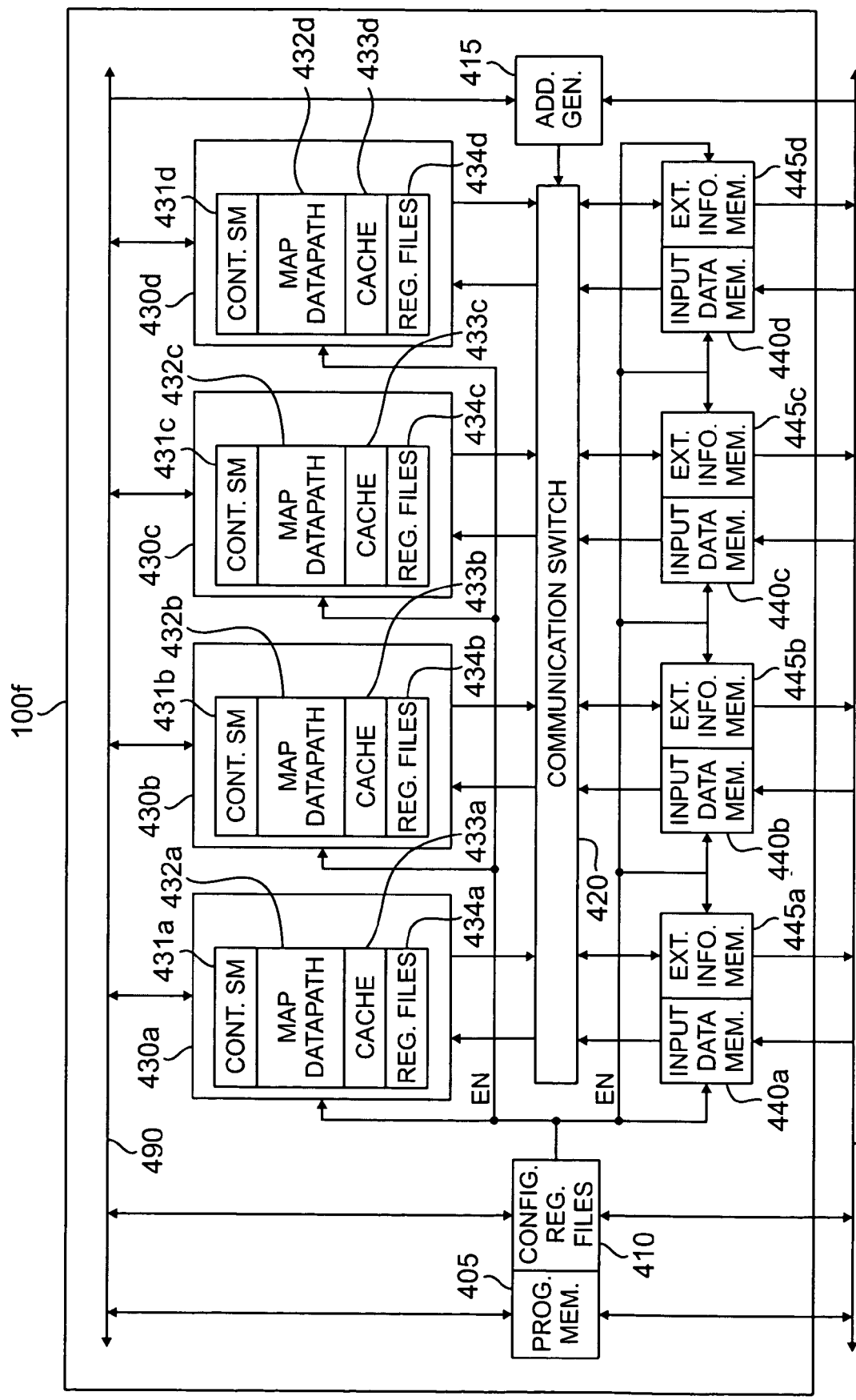
FIG. 4A is a block diagram of a reconfigurable turbo decoder that implements an interleaver and deinterleaver function according to the principles of the present disclosure.

FIG. 4A is a block diagram of a reconfigurable turbo decoder that implements an interleaver and deinterleaver function according to the principles of the present disclosure. Turbo decoder CRISP 100f comprises program memory 405, configuration register files 410, address generator 415, communication switch 420, processing units 430a-430d, input data memories 440a-440d, extrinsic information memories 445a-445d, and internal bus 490. Each one of processing units 430a-430d comprises a control state machine (SM), a maximum a-posteriori probability (MAP) datapath, a cache, and control register files. By way of example, processing cache 433a, and control register files 434a. Although four processing units 430 are illustrated in FIG. 4A, this is by way of example only. Other embodiments of turbo decoder CRISP 100f may implement less than four processing units 430 or more than four processing units 430.

A conventional MAP turbo decoder architecture generally comprises two primary functional blocks: i) soft-input, soft-output (SISO) stages that implement an a-posteriori probability (APP) algorithm; and ii) an interleaver/deinterleaver that scrambles the data according to the interleaving rules followed by the encoder in the transmitting device. Other blocks are required for the implementation of the decoder, such as a RAM (random-access memory) for storing data from each iteration of the decoder. Turbo decoder CRISP 100f includes all the building blocks of a conventional MAP turbo decoder. In an exemplary embodiment, each one of MAP datapaths 432a-432d implements a sliding window MAP algorithm. However, alternate embodiments of turbo decoder CRISP 100f may implement non-sliding window MAP algorithms.

In turbo decoder CRISP 100f, MAP datapaths 432a, 432b, 432c and 432d temporarily store the values of α (alpha), β (beta), and λ (lambda) in caches 433a, 433b, 433c, and 433d. The extrinsic information (i.e., the λ values) from each iteration for each decoding block is stored in extrinsic information memories 445a, 445b, 445c and 445d via communication switch 420. In an exemplary embodiment, MCU 370 loads a configuration program and configuration data into turbo decoder CRISP 100f via an external system bus (i.e., interconnect 325). The configuration program is stored in program memory 405. MCU 370 loads the configuration data into configuration register files 410 and control register files 434a-434d in order to initialize the register files. Configuration register files 410 and control register files 434a-434d are used to control which processing units 430a-430d, input data memories 440a-440d, and extrinsic information memories 445a-445d are used in an application. Configuration register files 410 provide enable (EN) signals to control processing units 430, input data memories 440, and extrinsic information memories 445. Turbo decoder CRISP 100f reads input data samples and writes decoded output data via the system bus (i.e., interconnect 325).

In order to achieve high decoding rates, turbo decoder CRISP 100f implements N parallel processing units 430a-430d. In this example, N=4. Processing units 430a-430d are independent and identical to each other. Each one of processing units 430a-430d is capable of connecting to each one of input data memories 440a-440d and extrinsic information memories 445a-445d via communication switch 420. For higher data rate standards, all of processing units 430a-430d may operate simultaneously and in parallel. For lower data rate standards, one or more of processing units 430a-430d may be set to a sleep mode (i.e., deactivated or disabled) in order to reduce power consumption.

As noted above, each one of processing units 430a-430d comprises control state machine 431, MAP datapath 432, cache 433 and control register files 434. In an exemplary embodiment of turbo decoder CRISP 100f, each processing unit 430 processes two soft input data samples at a time. The two soft input data samples correspond to two data symbols. In an exemplary embodiment, each soft input data sample may comprise 8 bits. MAP datapath 432 performs both forward and backward recursions over the trellis. During the forward recursion and optionally also during the backward recursion, both the input symbol and the extrinsic (λ) information must be accessed to compute the branch metric, γ (gamma). In order to reduce memory access power consumption, the γ value may be computed and stored in cache 433 in each processing unit 430. If the values of α, β, and λ are not calculated simultaneously, the a value may also be stored in cache 430 to reduce data movement and power consumption.

MAP datapath 432 may compute the α, β, and λ values in parallel or in consecutive (or sequential) order. Parallel execution is faster, but requires more die space and power consumption. Consecutive processing incurs longer delays, but requires less die space and less power consumption. In an exemplary embodiment, each one of MAP datapaths 430a-430d computes the α, β, and λ values sequentially. Control state machine 431 decodes instructions from program memory received via internal bus 490 and controls the overall operation and configuration of processing unit 430. Since turbo decoder CRISP 100f may compute large instruction loops, control state machine 431 may use a hardware loop to reduce overhead and power consumption.

There are eight memory blocks in turbo decoder CRISP 100f: four input data memories 440a that hold the input data (or symbol) samples and four extrinsic information memories 445 that hold the extrinsic information (i.e., λ values) generated in each half iteration of the turbo decoder. The eight memory blocks are divided into four logical memory banks. Each memory bank includes one input data memory 440 and one extrinsic information memory 445. By way of example, input data memory 440a and extrinsic information memory 445a form a first memory bank (Memory Bank 0), input data memory 440b and extrinsic information memory 445b form a second memory bank, (Memory Bank 1), and so forth.

Each one of processing units 430a-430d reads and writes to one memory bank at a time. Each one of processing units 430a-430d is capable of writing to each one of the memory banks. Thus, none of the memory banks is dedicated to a specific processing unit 430. For example, processing unit 430a may be connected by communication switch 420 to a first memory bank (e.g., memories 440a and 445a) during one memory cycle and may read from or write to another memory bank (e.g., memories 440c and 445c) during another memory cycle.

Communication switch 420 dynamically controls the connections between processing units 430a-430d and the memory banks comprised of memories 440a-440d and memories 445a-445d. The connection order or pattern is determined by the operation of address generator 415. Thus, communication switch 420 and address generator 415 together perform the interleaver and deinterleaver functions for a MAP decoder.

In one embodiment of the disclosure, address generator 415 may be implemented using a look-up table (LUT). In such an embodiment, the external control DSP/MCU, such as MCU 370, may pre-compute the interleaver pattern of the turbo decoder and write the interleaver pattern to the LUT in the memory of address generator 415 during an initialization phase. In another embodiment of the disclosure, address generator 415 may use programmable logic circuits to generate the interleaver pattern in real time.

According to the principles of the disclosure, MAP datapaths 432a-d are reconfigurable devices that may be modified to operate in turbo decoders or other types of decoders and may be modified to operate under different RF protocols. Thus, MAP datapaths 432a-d provide a generic architecture to support not only α (alpha), β (beta), λ (lambda), and γ (gamma) calculations, but also to support different communication systems that use MAP decoders.

Figure 4B:
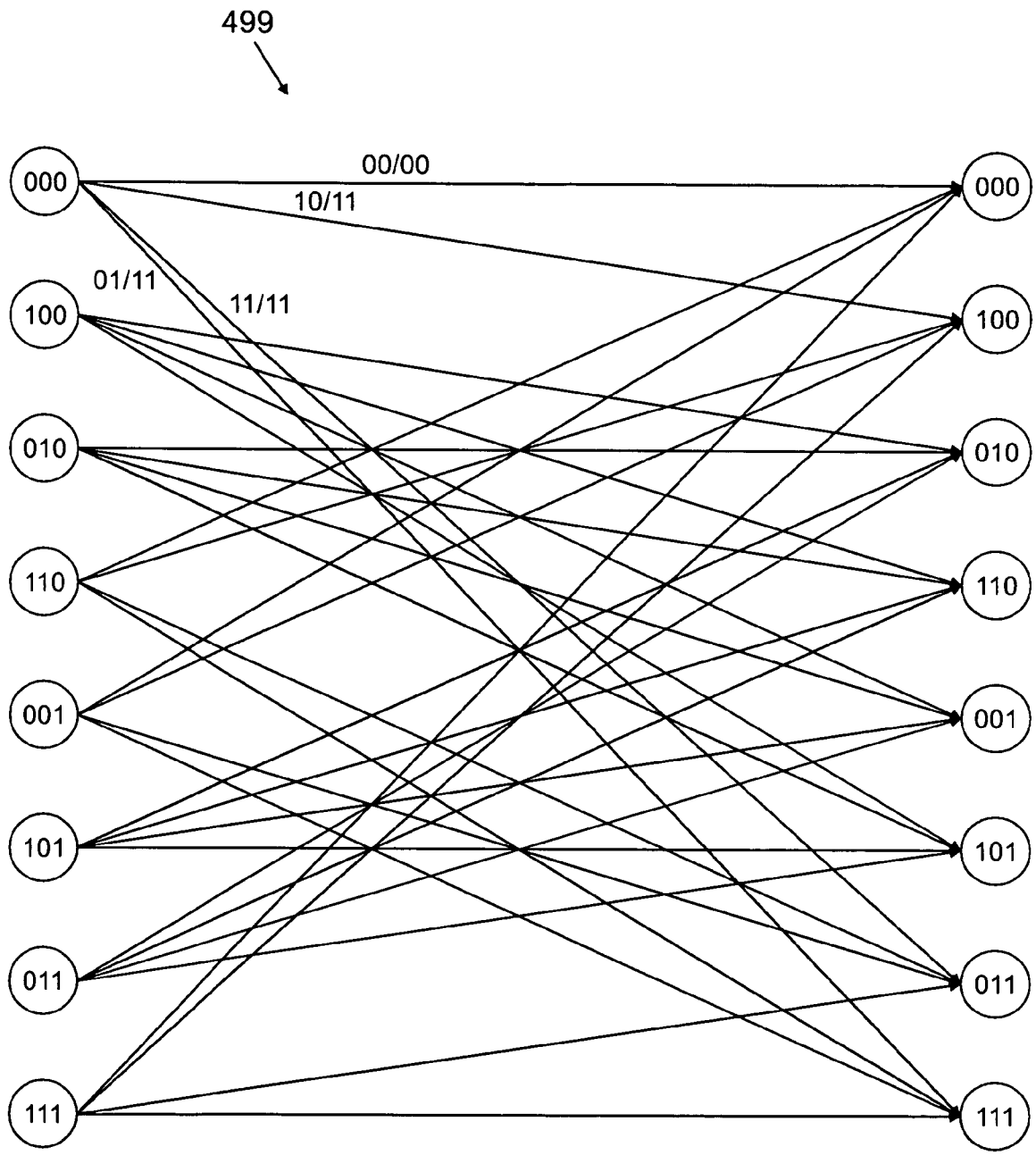
FIG. 4B is an exemplary trellis diagram for a WiBro wireless network.

A MAP algorithm may be represented by a trellis. Different communication systems, such as WCDMA, WiBro, or the like, use different trellises. FIG. 4B illustrates exemplary trellis 499 for a WiBro wireless network that may be implemented by reconfigurable MAP datapaths 432a-d. Inside trellis 499 in FIG. 4B, alpha, beta and lambda are calculated in either the forward direction or the backward direction. It is noted that there are eight states in trellis 499 and that there are four paths leading from a state at time t to a state at time t+1. This means there are 32 possible paths between states in trellis 499.

FIG. 5 is a table of exemplary interleaver parameters for interleaving data according to an IEEE-802.16d wireless protocol. In the example in FIG. 4A, four memory banks are used. If the non-interleaved input data is stored in consecutive order (or striped) across the 4 memory banks in FIG. 4A, there would be no collision if the interleaved data for addresses 0, 1, 2 and 3 are read simultaneously. It can be proven that:

$$(x+y) \bmod N = ((x) \bmod N + (y) \bmod N) \bmod N. \quad [\text{Eqn. 1}]$$

Thus, for j=4*k+0, the interleaved data is always in the same bank as j=0. For j=4*k+1, the interleaved data is always in the same bank as j=1. For j=4*k+2, the interleaved data is always in the same bank as j=2. For j=4*k+3, the interleaved data is always in the same bank as j=3.

For a block of N inputs (e.g., N 8-bit bytes), the operation j mod 4 (for j=0, 1, 2, ..., N−1) indicates in which memory bank (0, 1, 2, or 3), the jth non-interleaved address is stored. Thus, Memory Bank 0 stores every fourth input starting at address j=0 (i.e., j=0, 4, 8, 12, ...). Memory Bank 1 stores every fourth input starting at address j=1 (i.e., j=1, 5, 9, 13, ...). Memory Bank 2 stores every fourth input starting at address j=2 (i.e., j=2, 6, 10, 15, ...). Finally, Memory Bank 3 stores every fourth input starting at address j=3 (i.e., j=3, 7, 11, 16, ...).

The interleaved address i from each original (i.e., non-interleaved) address j is generated using the parameters P0, P1, P2, and P3 in FIG. 5. The interleaved addresses, i, for each of Memory Banks 0-3 are given by:

$$\text{Memory Bank 0: } i = (P0 \cdot j + 1) \bmod N \quad [\text{Eqn. 2}]$$

$$\text{Memory Bank 1: } i = (P0 \cdot j + 1 + N/2 + P1) \bmod N \quad [\text{Eqn. 3}]$$

$$\text{Memory Bank 2: } i = (P0 \cdot j + 1 + P2) \bmod N \quad [\text{Eqn. 4}]$$

$$\text{Memory Bank 3: } i = (P0 \cdot j + 1 + N/2 + P3) \bmod N \quad [\text{Eqn. 5}]$$

For an exemplary value of N=240, the parameters P0, P1, P2 and P3 in FIG. 5 simplify Equations 2-5 above as follows:

$$\text{Memory Bank 0: } i = (13j+) \bmod 240 \quad [\text{Eqn. 6}]$$

$$\text{Memory Bank 1: } i = (13j+241) \bmod 240 \quad [\text{Eqn. 7}]$$

$$\text{Memory Bank 2: } i = (13j+61) \bmod 240 \quad [\text{Eqn. 8}]$$

$$\text{Memory Bank 3: } i = (13j+301) \bmod 240 \quad [\text{Eqn. 9}]$$

FIG. 6 illustrates a table of 240 sets of duo-binary data (i.e., WiBro operation) that are logically segmented into blocks for processing by the MAP datapaths in FIG. 4A. In FIG. 6, the 240 sets of duo-binary data are organized in 4 columns, labeled C0, C1, C2, C3, and 60 rows, labeled R0 through R59. The 240 sets of duo-binary data are labeled with the original addresses 0-239 (i.e., non-interleaved format).

The duo-binary data in column C0 are stored in the logical memory bank (or block) comprising input data memory 440a and external information memory 445a in FIG. 4A. The duo-binary data in column C1 are stored in the logical memory bank (or block) comprising input data memory 440b and external information memory 445b. The duo-binary data in column C2 are stored in the logical memory bank (or block) comprising input data memory 440c and external information memory 445c. Finally, the duo-binary data in column C3 are stored in the logical memory bank (or block) comprising input data memory 440d and external information memory 445d.

The 240 sets of duo-binary data are logically partitioned into four (4) data blocks, namely Block 0, Block 1, Block 2 and Block 3. Block 0 contains the first 61 sets of duo-binary data, labeled as addresses 0-60. Block 1 contains the second 61 sets of duo-binary data, labeled as addresses 61-121. Block 2 contains the third 61 sets of duo-binary data, labeled as addresses 122-182. Block 3 contains the last 57 sets of duo-binary data, labeled as addresses 183-239.

Processing unit 430a in FIG. 4A processes the duo-binary data in Block 0 during execution of the MAP algorithm. Similarly, during execution of the MAP algorithm, processing unit 430b processes the duo-binary data in Block 1, processing unit 430c processes the duo-binary data in Block 2, and processing unit 430d processes the duo-binary data in Block 3.

In order to allow processing units 430a-d to access the duo-binary data in a collision-free manner, the 240 sets of duo-binary data are striped across the memory banks in the order the duo-binary data are received. Thus, the first four sets of duo-binary data, corresponding to non-interleaved addresses j=0, 1, 2 and 3, are written to the first address location in each of Memory Bank 0, Memory Bank 1, Memory Bank 2, and Memory Bank 3, respectively. The second four sets of duo-binary data, corresponding to non-interleaved addresses j=4, 5, 6 and 7, are written to the second address location in each of Memory Bank 0, Memory Bank 1, Memory Bank 2, and Memory Bank 3, respectively. This process continues until the last four sets of duo-binary data, corresponding to non-interleaved addresses j=236, 237, 238 and 239, are written to the last address location in each of Memory Bank 0, Memory Bank 1, Memory Bank 2, and Memory Bank 3, respectively.

In an exemplary embodiment of the disclosure, the WiBro input to the turbo encoder in the transmitting device is a sequence of pairs of 8-bit bytes: [$a_0b_0$, $a_1b_1$, $a_2b_2$, ..., $a_{230}b_{239}$]. In such an example, if the coding rate is 1/3, the WiBro output of the turbo encoder is the sequence: [$a_0b_0w_0y_0w_0'y_0'$, $a_1b_1w_1y_1w_1'y_1'$, . . . , $a_{239}b_{239}w_{239}y_{239}w_{239}'y_{230}'$], where $a_k$ and $b_k$ are the kth pair of duo-binary systematic data bytes (i.e., the original input data), $w_k$ and $y_k$ are the kth non-interleaved pair of parity bytes, and $w_k'$ and $y_k'$ are the kth interleaved pair of parity bytes. Thus, the 16 bits in the input systematic pair $a_k b_k$ result in 48 bits in the output sequence $a_k b_k w_k y_k w_k' y_k'$. In FIG. 6, each set of duo-binary data labeled with the addresses 0-239 represents forty-eight (48) bits of data: $[a_k b_k w_k y_k w_k' y_k']$.

Because of the interleaving operation, however, the kth pair of interleaved parity bytes, $w_k'$ and $y_k'$, do not correspond to the kth pair of duo-binary systematic bytes, $a_k$ and $b_k$, and also do not correspond to the kth pair of non-interleaved parity bytes, $w_k$ and $y_k$. Thus, in FIG. 6, the first systematic bytes and the corresponding non-interleaved parity bytes $[a_0 b_0 w_0 y_0]$ for address 0 are stored at column C0, row R0. However, the non-interleaved parity bytes $[w_0' y_0']$ stored in column C0, row R0, are not related to $[a_0 b_0 w_0 y_0]$.

Figures 1, 7:
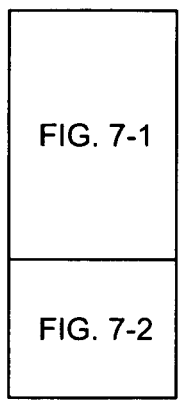
FIG. 7 illustrates a table of the original (non-interleaved) addresses of the interleaved parity bytes associated with the 240 sets of duo-binary data in FIG. 6.

FIG. 7 illustrates a table of the original (non-interleaved) addresses of the interleaved parity bytes associated with the 240 sets of duo-binary data in FIG. 6. The interleaved addresses are calculated using Equations 6-9 above. By way of example, for the first four inputs, j=0, 1, 2, 3, Equations 6-9 give the interleaved addresses, i:

Memory Bank 0: $i=(13 \times 0+1) \bmod 240=1$     [Eqn. 10]

Memory Bank 1: $i=(13 \times 1+241) \bmod 240=14$     [Eqn. 11]

Memory Bank 2: $i=(13 \times 2+61) \bmod 240=87$     [Eqn. 12]

Memory Bank 3: $i=(13 \times 3+301) \bmod 240=100$     [Eqn. 13]

These exemplary first four values are written in columns C0-C3 of row 0, respectively in FIG. 7.

During an odd half-iteration of the MAP algorithm, address generator 415 and communication switch 420 provide processing units 430a-430d with access to the systematic data and the non-interleaved parity data in a straightforward sequential manner: the first set (address 0) of duo-binary data, $[a_0 b_0 w_0 y_0]$, are stored at row R0-column C0, the second set (address 1) of duo-binary data, $[a_1 b_1 w_1 y_1]$, are stored at row R0-column C1, and so forth. Thus, address generator 415 uses the table in FIG. 6 to provide the systematic data and the non-interleaved parity data to processing units 430a-430b during the odd half-iteration.

Figure 8:
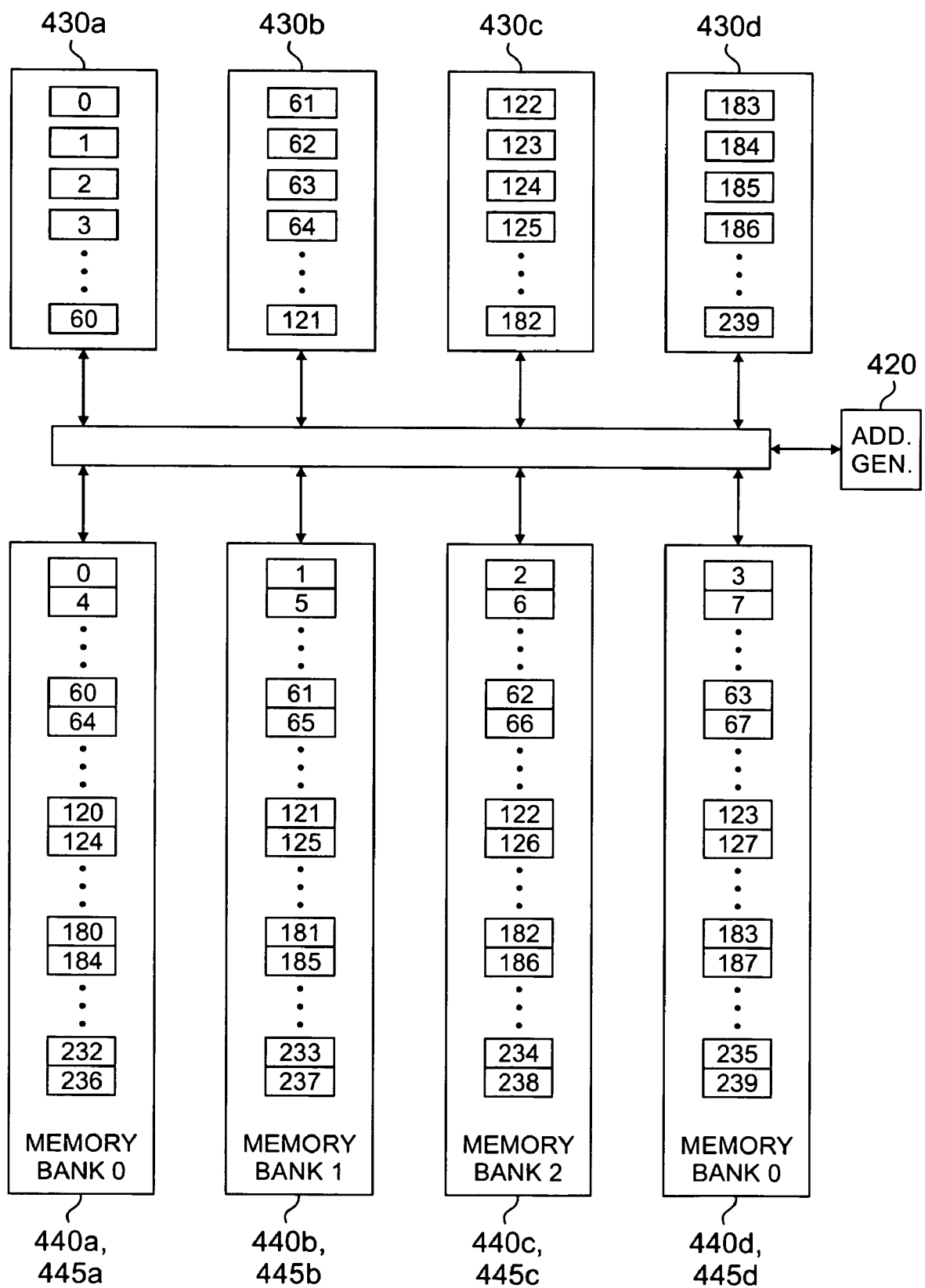
FIG. 8 is a simplified diagram of selected portions of the reconfigurable turbo decoder during the odd half-iteration of the MAP algorithm.

FIG. 8 is a simplified diagram of selected portions of the reconfigurable turbo decoder in FIG. 4A during the odd half-iteration of the MAP algorithm. Processing unit 430a processes the first 61 addresses (0-60), processing unit 430b processes the second 61 addresses (61-121), processing unit 430c processes the third 61 addresses (122-182), and processing unit 430d processes the last 57 addresses (183-239). Memory Bank 0 (i.e., memories 440a and 445a) stores every fourth address beginning at address 0 (i.e., 0, 4, 8, 12, . . .). Memory Bank 1 (i.e., memories 440b and 445b) stores every fourth address beginning at address 1 (i.e., 1, 5, 9, 13, . . .). Memory Bank 2 (i.e., memories 440c and 445c) stores every fourth address beginning at address 2 (i.e., 2, 6, 10, 14, . . .). Memory Bank 3 (i.e., memories 440d and 445d) stores every fourth address beginning at address 3 (i.e., 3, 7, 11, 15, . . .).

During a first memory cycle, processing unit 430a accesses address 0 in Memory Bank 0, processing unit 430b accesses address 61 in Memory Bank 1, processing unit 430c accesses address 122 in Memory Bank 2, and processing unit 430d accesses address 183 in Memory Bank 3, all without collision. During a second memory cycle, processing unit 430a accesses address 1 in Memory Bank 1, processing unit 430b accesses address 62 in Memory Bank 2, processing unit 430c accesses address 122 in Memory Bank 2, and processing unit 430d accesses address 184 in Memory Bank 0, all without collision. This collision-free process continues throughout the entire odd half iteration.

During an even half-iteration of the MAP algorithm, the interleaved pairs of parity bytes must also be accessed. However, as noted above in FIG. 7, the interleaved parity bytes do not correspond to the same addresses as the systematic data bytes and the non-interleaved parity bytes.

Figures 1, 9:
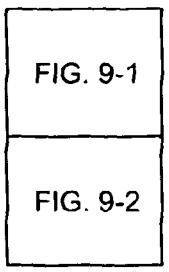
FIG. 9 is a look-up table (or memory map) for accessing the interleaved parity data in the four exemplary memory banks in FIG. 4A during execution of the MAP algorithm.

FIG. 9 is a look-up table (or memory map) for accessing the interleaved parity data in the four exemplary memory banks in FIG. 4A during execution of the MAP algorithm. For simplicity, not all entries in the look-up table are shown. During an even half-iteration of the MAP algorithm, address generator 415 and communication switch 420 provide processing units 430a-430d with access to the interleaved parity data using the look-up table (LUT) in FIG. 9.

FIG. 9 is organized in columns that correspond to processing units 430a-430d. For example, each entry in column C0 of FIG. 9 contains the row and column of an interleaved address in FIG. 7 corresponding to one of the 61 non-interleaved addresses (0-60) processed by processing unit 430a during the MAP algorithm. Similarly columns C1, C2 and C3 of FIG. 9 correspond to processing units 430b, 430c and 430d, respectively.

By way of example, going down through column C0 from row R0 to row R60 will sequentially access the interleaved addresses in FIG. 7. The entry in column C0, row R0 in FIG. 9 gives bank 3, address 35 in Memory Banks 0-3. This corresponds to column C3, row R35 in FIG. 7, which contains interleaved address 0. The entry in column C0, row R1 in FIG. 9 gives bank 0, address 0 in Memory Banks 0-3. This corresponds to column C0, row R0 in FIG. 7, which contains interleaved address 1. The entry in column C0, row R2 in FIG. 9 gives bank 1, address 9 in Memory Banks 0-3. This corresponds to column C1, row R9 in FIG. 7, which contains interleaved address 2.

Thus, using the LUT in FIG. 9, address generator 420 and communication switch 420 enable processing units 430a-430d to access simultaneously the correct interleaved addresses in Memory Banks 0-3 without collisions. It is noted that no two bank addresses in each row of FIG. 9 are ever the same. For example, in row R0 of FIG. 9, processing unit 430a accesses interleaved address 0 in Memory Bank 3, processing unit 430b accesses interleaved address 61 in Memory Bank 0, processing unit 430c accesses interleaved address 122 in Memory Bank 1, and processing unit 430d accesses interleaved address 183 at Memory Bank 2. These memory accesses occur simultaneously and without collision.

The present disclosure presents a parallel, collision-free implementation for the above interleaved pattern. The exemplary embodiment uses four (4) memory banks and four (4) sliding windows at the same time. The input data is split into four (4) blocks, one for each memory bank. However, this specific embodiment is by way of example only. The present disclosure may be readily adapted to more than 4 memory banks or less than 4 memory banks. Also, the size N of the input data may be more or less than 240 duo-binary inputs. Similarly, in a WCDMA embodiment, the present disclosure may be adapted to 480 binary inputs in place of 240 duo-binary inputs.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A reconfigurable maximum a-posteriori probability (MAP) calculation circuit for decoding duo-binary code data and binary code data, the reconfigurable MAP calculation circuit comprising:
   M memory banks for storing N input data samples, wherein each input data sample comprises systematic data, non-interleaved parity data and interleaved parity data, wherein the N input data samples are logically divided into M logical blocks and wherein input data samples from each of the M logical blocks are stored in each of the M memory banks;
   M processing units for performing MAP calculations, wherein each of the M processing units is capable of accessing each of the N input data samples in the M memory banks and wherein each of the M processing units is dedicated to processing one of the M logical blocks of input data samples;
   a communication switch capable of coupling the M processing units to the M memory banks; and
   an address generator for controlling the communication switch and the M processing units such that the M processing units simultaneously access input data samples from each of the M logical blocks in each of the M memory banks without collision.

2. The reconfigurable MAP calculation circuit as set forth in claim 1, wherein the address generator controls the communication switch and the M processing units such that the M processing units simultaneously access systematic data and non-interleaved data from each of the M logical blocks in each of the M memory banks without collision during an odd half iteration of a MAP algorithm executed by each of the M processing units.

3. The reconfigurable MAP calculation circuit as set forth in claim 2, wherein address generator uses a non-interleaved memory map to enable the M processing units to simultaneously access systematic data and non-interleaved data from each of the M logical blocks in each of the M memory banks without collision.

4. The reconfigurable MAP calculation circuit as set forth in claim 2, wherein the address generator controls the communication switch and the M processing units such that the M processing units simultaneously access interleaved data from each of the M logical blocks in each of the M memory banks without collision during an even half iteration of a MAP algorithm executed by each of the M processing units.

5. The reconfigurable MAP calculation circuit as set forth in claim 4, wherein address generator uses an interleaved memory map to enable the M processing units to simultaneously access interleaved data from each of the M logical blocks in each of the M memory banks without collision.

6. The reconfigurable MAP calculation circuit as set forth in claim 1, wherein input data samples from each of the M logical blocks are striped sequentially across the M memory banks.

7. The reconfigurable MAP calculation circuit as set forth in claim 6, wherein input data samples from the first logical block are striped sequentially across the M memory banks beginning at the first memory bank and input data samples from the ith logical blocks are striped sequentially across the M memory banks beginning at the ith memory bank.

8. The reconfigurable MAP calculation circuit as set forth in claim 1, wherein the M memory banks are ordered from memory bank 0 to memory bank M−1 and the M logical blocks are ordered from logical block 0 to logical block M−1, and wherein input data samples from logical block 0 are striped sequentially across the M memory banks from memory bank 0 to memory bank M−1 beginning at a first address in memory bank 0, input data samples from logical block 1 are striped sequentially across the M memory banks from memory bank 0 to memory bank M−1 beginning at a first address in memory bank 1, and input data samples from logical block i are striped sequentially across the M memory banks from memory bank 0 to memory bank M−1 beginning at a first address in memory bank i, where i is an integer between 0 and M−1.

9. A reconfigurable turbo decoder for decoding duo-binary code data and binary code data, the reconfigurable turbo decoder comprising a maximum a-posteriori probability (MAP) calculation circuit comprising:
   M memory banks for storing N input data samples, wherein each input data sample comprises systematic data, non-interleaved parity data and interleaved parity data, wherein the N input data samples are logically divided into M logical blocks and wherein input data samples from each of the M logical blocks are stored in each of the M memory banks;
   M processing units for performing MAP calculations, wherein each of the M processing units is capable of accessing each of the N input data samples in the M memory banks and wherein each of the M processing units is dedicated to processing one of the M logical blocks of input data samples;
   a communication switch capable of coupling the M processing units to the M memory banks; and
   an address generator for controlling the communication switch and the M processing units such that the M processing units simultaneously access input data samples from each of the M logical blocks in each of the M memory banks without collision.

10. The reconfigurable turbo decoder as set forth in claim 9, wherein the address generator controls the communication switch and the M processing units such that the M processing units simultaneously access systematic data and non-interleaved data from each of the M logical blocks in each of the M memory banks without collision during an odd half iteration of a MAP algorithm executed by each of the M processing units.

11. The reconfigurable turbo decoder as set forth in claim 10, wherein address generator uses a non-interleaved memory map to enable the M processing units to simultaneously access systematic data and non-interleaved data from each of the M logical blocks in each of the M memory banks without collision.

12. The reconfigurable turbo decoder as set forth in claim 10, wherein the address generator controls the communication switch and the M processing units such that the M processing units simultaneously access interleaved data from each of the M logical blocks in each of the M memory banks without collision during an even half iteration of a MAP algorithm executed by each of the M processing units.

13. The reconfigurable turbo decoder as set forth in claim 12, wherein address generator uses an interleaved memory map to enable the M processing units to simultaneously access interleaved data from each of the M logical blocks in each of the M memory banks without collision.

14. The reconfigurable turbo decoder as set forth in claim 9, wherein input data samples from each of the M logical blocks are striped sequentially across the M memory banks.

15. The reconfigurable turbo decoder as set forth in claim 14, wherein input data samples from the first logical block are striped sequentially across the M memory banks beginning at the first memory bank and input data samples from the ith logical blocks are striped sequentially across the M memory banks beginning at the ith memory bank.

16. The reconfigurable turbo decoder as set forth in claim 9, wherein the M memory banks are ordered from memory bank 0 to memory bank M−1 and the M logical blocks are ordered from logical block 0 to logical block M−1, and wherein input data samples from logical block 0 are striped sequentially across the M memory banks from memory bank 0 to memory bank M−1 beginning at a first address in memory bank 0, input data samples from logical block 1 are striped sequentially across the M memory banks from memory bank 0 to memory bank M−1 beginning at a first address in memory bank 1, and input data samples from logical block i are striped sequentially across the M memory banks from memory bank 0 to memory bank M−1 beginning at a first address in memory bank i, where i is an integer between 0 and M−1.

17. A software-defined radio (SDR) system that operates under a plurality of wireless communication standards, the SDR system comprising a reconfigurable maximum a-posteriori probability (MAP) calculation circuit for decoding duo-binary code data and binary code data, the reconfigurable MAP calculation circuit comprising:
M memory banks for storing N input data samples, wherein each input data sample comprises systematic data, non-interleaved parity data and interleaved parity data, wherein the N input data samples are logically divided into M logical blocks and wherein input data samples from each of the M logical blocks are stored in each of the M memory banks;
M processing units for performing MAP calculations, wherein each of the M processing units is capable of accessing each of the N input data samples in the M memory banks and wherein each of the M processing units is dedicated to processing one of the M logical blocks of input data samples;
a communication switch capable of coupling the M processing units to the M memory banks; and
an address generator for controlling the communication switch and the M processing units such that the M processing units simultaneously access input data samples from each of the M logical blocks in each of the M memory banks without collision.

18. The software-defined radio (SDR) system as set forth in claim 17, wherein the address generator controls the communication switch and the M processing units such that the M processing units simultaneously access systematic data and non-interleaved data from each of the M logical blocks in each of the M memory banks without collision during an odd half iteration of a MAP algorithm executed by each of the M processing units.

19. The software-defined radio (SDR) system as set forth in claim 18, wherein address generator uses a non-interleaved memory map to enable the M processing units to simultaneously access systematic data and non-interleaved data from each of the M logical blocks in each of the M memory banks without collision.

20. The software-defined radio (SDR) system as set forth in claim 18, wherein the address generator controls the communication switch and the M processing units such that the M processing units simultaneously access interleaved data from each of the M logical blocks in each of the M memory banks without collision during an even half iteration of a MAP algorithm executed by each of the M processing units.

21. The software-defined radio (SDR) system as set forth in claim 20, wherein address generator uses an interleaved memory map to enable the M processing units to simultaneously access interleaved data from each of the M logical blocks in each of the M memory banks without collision.

22. The software-defined radio (SDR) system as set forth in claim 17, wherein input data samples from each of the M logical blocks are striped sequentially across the M memory banks.

23. The software-defined radio (SDR) system as set forth in claim 22, wherein input data samples from the first logical block are striped sequentially across the M memory banks beginning at the first memory bank and input data samples from the ith logical blocks are striped sequentially across the M memory banks beginning at the ith memory bank.

24. The software-defined radio (SDR) system as set forth in claim 17, wherein the M memory banks are ordered from memory bank 0 to memory bank M−1 and the M logical blocks are ordered from logical block 0 to logical block M−1, and wherein input data samples from logical block 0 are striped sequentially across the M memory banks from memory bank 0 to memory bank M−1 beginning at a first address in memory bank 0, input data samples from logical block 1 are striped sequentially across the M memory banks from memory bank 0 to memory bank M−1 beginning at a first address in memory bank 1, and input data samples from logical block i are striped sequentially across the M memory banks from memory bank 0 to memory bank M−1 beginning at a first address in memory bank i, where i is an integer between 0 and M−1.

* * * * *

UNITED STATES PATENT AND TRADEMARK OFFICE
CERTIFICATE OF CORRECTION

| | | |
|---|---|---|
| PATENT NO. | : 7,752,530 B2 | Page 1 of 1 |
| APPLICATION NO. | : 11/581674 | |
| DATED | : July 6, 2010 | |
| INVENTOR(S) | : Yan Wang et al. | |

It is certified that error appears in the above-identified patent and that said Letters Patent is hereby corrected as shown below:

Column 7, line 25, insert --unit 430 comprises control state machine 431a, MAP datapath 432a-- after the term "processing".

Signed and Sealed this
Thirtieth Day of August, 2011

David J. Kappos
*Director of the United States Patent and Trademark Office*